United States Patent
Fusegawa et al.

[11] Patent Number: 6,117,231
[45] Date of Patent: Sep. 12, 2000

[54] METHOD OF MANUFACTURING SEMICONDUCTOR SILICON SINGLE CRYSTAL WAFER

[75] Inventors: Izumi Fusegawa; Toshirou Hayashi; Ryoji Hoshi; Tomohiko Ohta, all of Fukushima-ken, Japan

[73] Assignee: Shin-Etsu Handotai Co., Ltd., Tokyo, Japan

[21] Appl. No.: 09/290,261

[22] Filed: Apr. 13, 1999

[30] Foreign Application Priority Data

May 1, 1998 [JP] Japan .................................. 10-122142

[51] Int. Cl.[7] .................................................. C30B 15/00
[52] U.S. Cl. .................................. 117/30; 117/13; 117/32
[58] Field of Search .................................. 117/13, 36, 32

[56] References Cited

U.S. PATENT DOCUMENTS 4,659,421  4/1987  Jewett ..................................... 117/201

*Primary Examiner*—Felisa Hiteshew
*Attorney, Agent, or Firm*—Arent Fox Kitner Plotkin & Kahn PLLC

[57] ABSTRACT

A silicon wafer sliced from a silicon single crystal having a low oxygen concentration is used as an epitaxial substrate to provide semiconductor silicon single crystal wafers exhibiting good electrical characteristics at a low cost. A semiconductor silicon single crystal having a resistivity in a range of 0.005 to 0.02 Ω·cm and an oxygen concentration of $12 \times 10^{17}$ atoms/cm$^3$ (ASTM'79) or less is manufactured by a Czochralski (CZ) method. The resulting silicon single crystal is shaped into a silicon single crystal substrate on which a silicon single crystal is epitaxially grown.

8 Claims, 3 Drawing Sheets

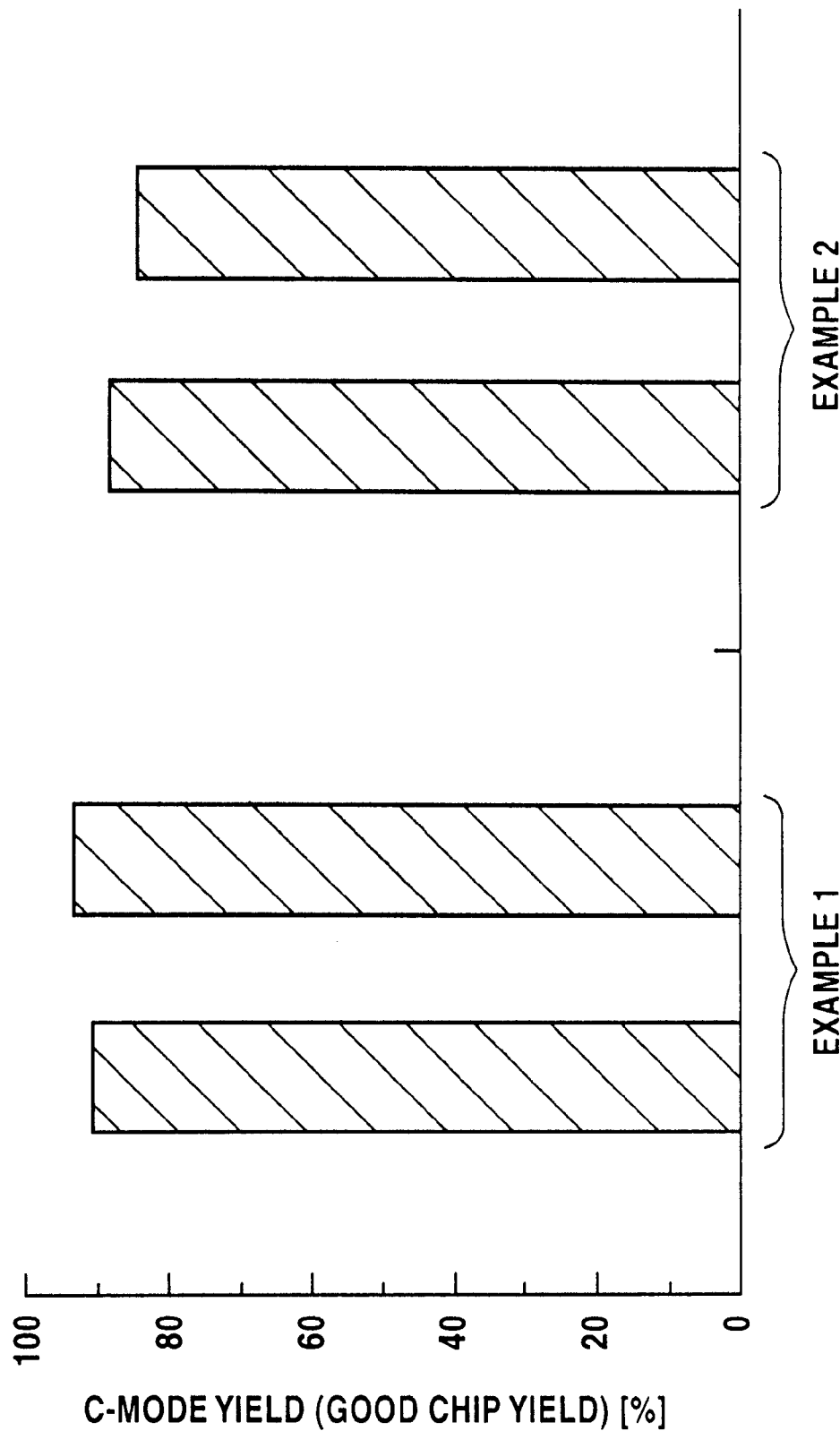

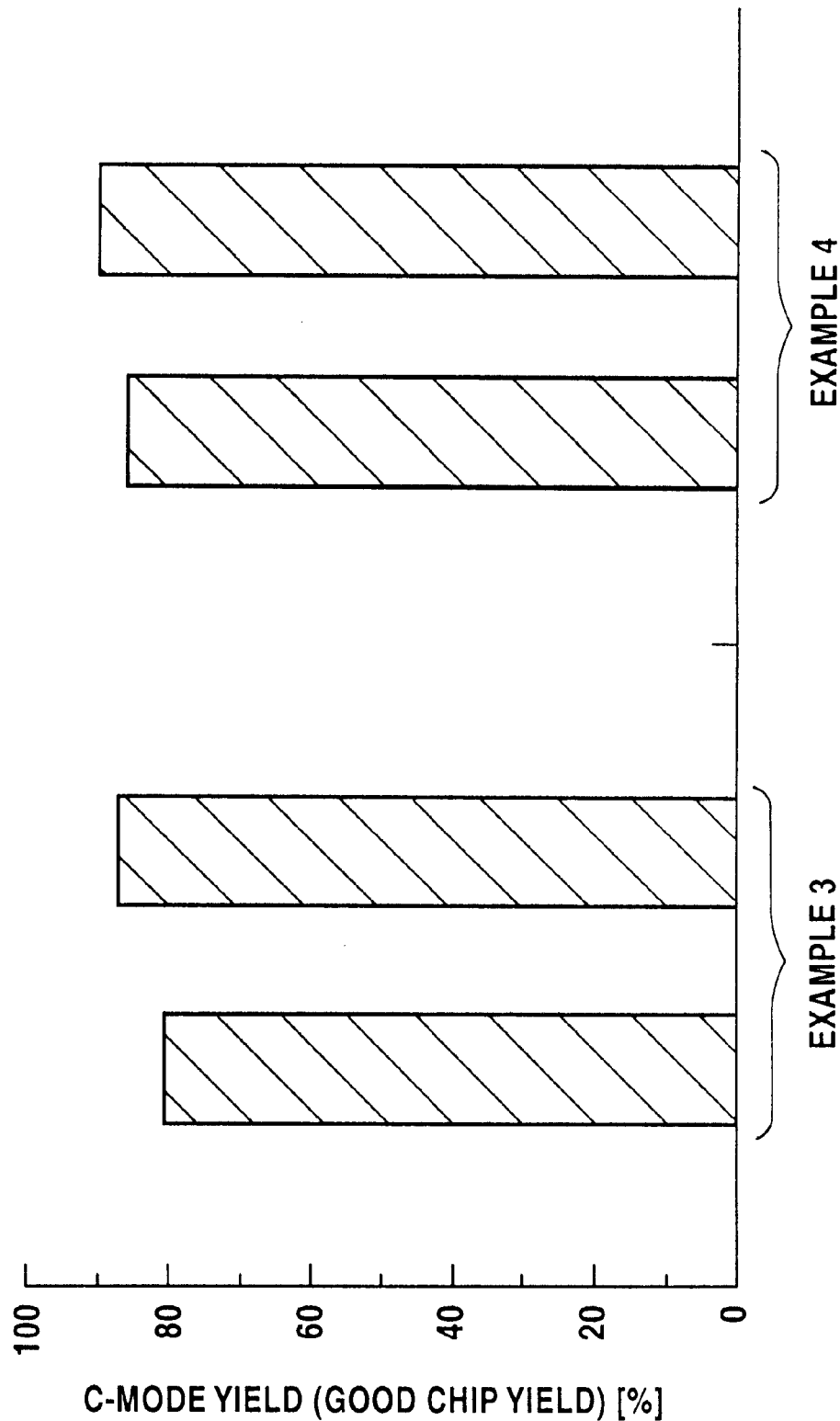

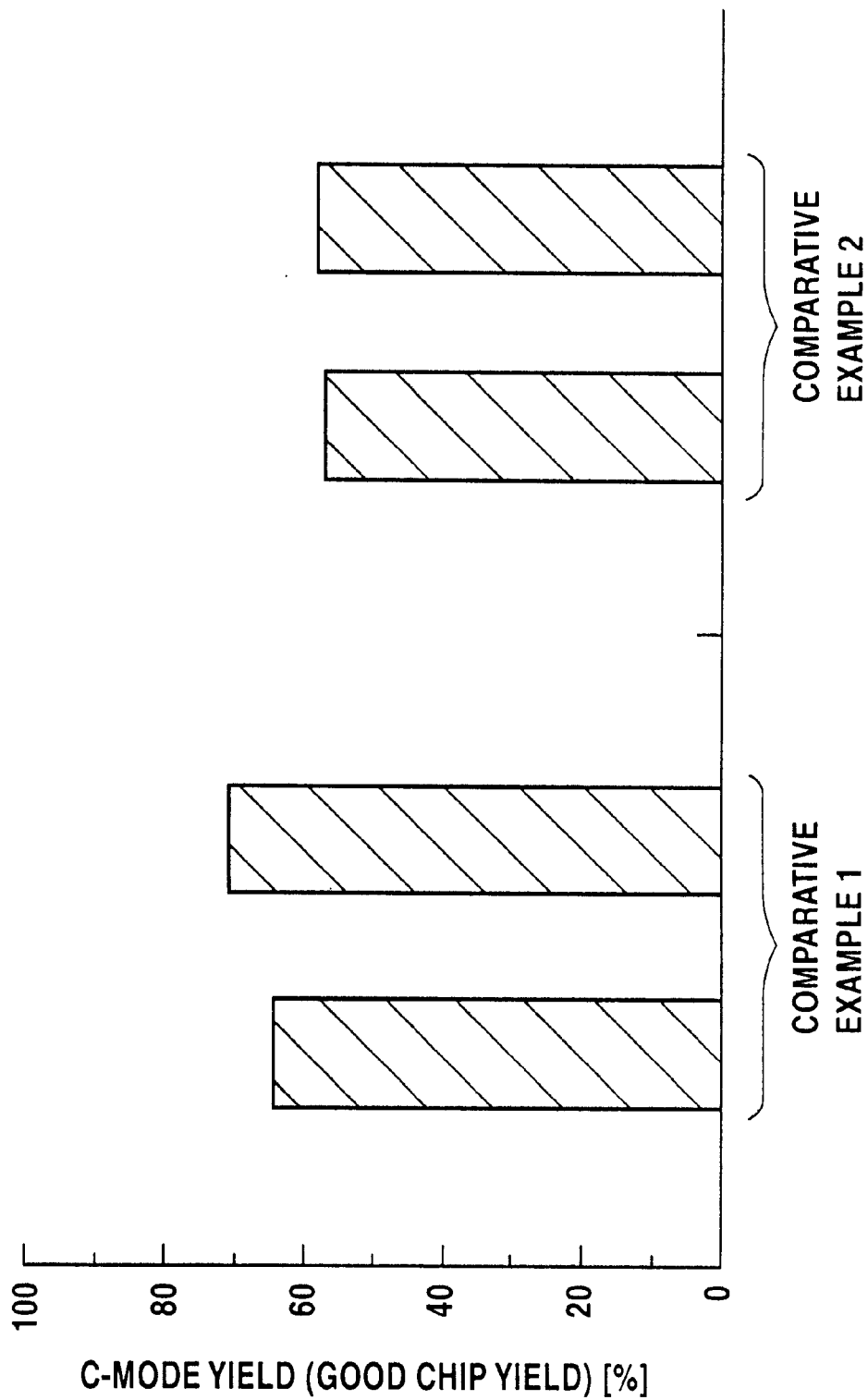

METHOD OF MANUFACTURING SEMICONDUCTOR SILICON SINGLE CRYSTAL WAFER

BACKGROUND OF THE INVENTION

1. Field of the Invention

The present invention relates generally to a method of manufacturing a semiconductor silicon single crystal wafer (hereinafter also referred to simply as a "silicon wafer" or a "wafer"), and more particularly, to a method of manufacturing a high quality epitaxial wafer which is required to improve electrical characteristics of the silicon wafer for use in manufacturing highly integrated semiconductor devices.

2. Description of the Related Art

Conventionally, silicon single crystal wafers made from a silicon single crystal, for use in highly integrated and miniatuarized semiconductor devices, have been produced by a Czochralski method (hereinafter the "CZ method") which is advantageous in manufacturing wafers of larger diameters.

Since the method of producing a silicon single crystal according to the CZ method utilizes a quartz crucible, oxygen atoms dissolved into a silicon melt from the quartz crucible are trapped into a silicon single crystal while the crystal is grown.

Such oxygen atoms exist at interstitial positions in a silicon single crystal in a super saturation state, so that they are deposited to form bulk micro defects (BMD) during heat treatment steps in fabricating semiconductor devices. Since the semiconductor devices have electrical circuits formed in the vicinity of a surface of the silicon single crystal wafer, BMD formed in such a region, if any, would cause problems such as a significant degradation of electrical characteristics such as time zero dielectric breakdown (TZDB) or the like.

To solve such problems, an intrinsic gettering (IG) heat treatment is generally used before a semiconductor device fabricating step as a particular pre-heat treatment.

This is a heat treatment method which involves a high temperature heat treatment conducted to a silicon wafer containing interstitial oxygen atoms, manufactured by the CZ method, to reduce the interstitial oxygen concentration on the surface of the silicon wafer through out-diffusion of the oxygen atoms therein, thereby forming a defect-free layer in the vicinity of the surface, and then heat treatment for oxygen precipitation nuclei formation at a low temperature to form BMD within the wafer.

With this treatment, the surface of the wafer, which serves as a semiconductor device fabricating region, is defect free, and the BMD incorporated within the wafer serves as gettering sites for heavy metal impurities during heat treatment steps or the like, thereby providing a high quality wafer.

However, in the recent increasingly highly integrated semiconductor devices, there are BMD remaining on the surface of the silicon wafer after the IG heat treatment due to an insufficient reduction of interstitial oxygen concentration, and a grown-in defect (see Semicond. Sci. Technol. 7, 1992, 135) introduced into a single crystal during crystal growth, which remains in the silicon single crystal wafer (see Jpn. J. Appl. Phys. Vol. 36, 1997 L591–594), thereby causing a problem of deteriorating electrical characteristics of the devices.

To solve these problems, in one method, a high quality semiconductor silicon single crystal wafer is produced by epitaxially growing a silicon single crystal on a silicon single crystal wafer. The epitaxial growth essentially differs from growth of a single crystal by the CZ method in the mechanism of growth. For example, when $SiH_2Cl_2$ is used as a source gas, $SiCl_2$ molecules dissolved at high temperatures chemically adsorb to hollow bridge sites.

Then, as $Cl_2$ molecules are removed from the $SiCl_2$ molecules through a surface reaction with $H_2$ molecules, Si epitaxially and regularly grows on the silicon single crystal wafer in a parallel state. Therefore, according to this method, there can be produced silicon single crystal wafers which are for fabricating high quality semiconductor devices and free from micro-defects such as grown-in defects, without introducing growth striations in CZ crystal growth.

However, when a high interstitial oxygen concentration exists in a silicon single crystal wafer for epitaxial growth, interstitial oxygen atoms in the silicon single crystal diffuse into an epitaxial layer due to a heat treatment during epitaxial growth to form defects (see Extended Abstracts of The 42nd Spring Meeting, 28p-ZW-8, 1995, The Japan Society of Applied Physics and Related Societies), sometimes resulting in deteriorated electrical characteristics of semiconductor devices fabricated using such a silicon single crystal wafer.

While a manufacturing method has been proposed as measures taken against the above-mentioned problem by performing a high temperature heat treatment before epitaxial growth to reduce the interstitial oxygen concentration of a silicon single crystal wafer, this proposed method introduces another problem of industrially increasing a cost due to the addition of the heat treatment step.

OBJECT AND SUMMARY OF THE INVENTION

The present invention has been made in view of the problems inherent to the prior art mentioned above, and its object is to provide a semiconductor silicon single crystal wafer exhibiting good electrical characteristics at a low cost by using a silicon wafer sliced from a silicon single crystal having a low oxygen concentration for an epitaxial wafer.

To solve the problems mentioned above, the present invention provides, in a first aspect, a method of manufacturing a semiconductor silicon single crystal wafer comprising the steps of producing a semiconductor silicon single crystal having a resistivity in a range of 0.005 to 0.02 $\Omega \cdot cm$ and an oxygen concentration of $12 \times 10^{17}$ atoms/cm$^3$ (ASTM'79) or less by a Czochralski method, shaping said silicon single crystal into a silicon single crystal wafer, and epitaxially growing a silicon single crystal on said silicon single crystal wafer.

Also, in a second aspect, the present invention provides a method of manufacturing a semiconductor silicon single crystal wafer comprising the steps of producing a semiconductor silicon single crystal having a resistivity in a range of 1 to 30 $\Omega \cdot cm$ and an oxygen concentration of $12 \times 10^{17}$ atoms/cm$^3$ (ASTM'79) or less by a Czochralski method, shaping said silicon single crystal into a silicon single crystal wafer, and epitaxially growing a silicon single crystal on said silicon single crystal wafer.

Preferably, the silicon single crystal is produced by a magnetic field applied Czochralski (MCZ) method which is effective in reducing the oxygen concentration within a silicon single crystal, as disclosed in Japanese Patent Laid-open Publication No. 56-104791 and others.

In the present invention, while similar effects can be generated using silicon single crystals with a low oxygen concentration produced either by the CZ method or by the MCZ method, the production by the MCZ method is more effective for providing silicon single crystals with a low oxygen concentration.

Normal wafers typically used in the current semiconductor device fabrication have the resistivity in a range of 1 to 30 Ω·cm, while wafers expected to generate effects of gettering and a measure against the latch-up with a high doping concentration of boron have the resistivity in a range of 0.005 to 0.02 Ω·cm. The method according to the present invention is applicable to wafers having either resistivity.

When MOS diodes fabricated using a wafer manufactured according to the method of the present invention are evaluated for an oxide film breakdown characteristic, they exhibit good electrical characteristics. However, if MOS diodes are fabricated from a wafer sliced from a semiconductor silicon single crystal having an oxygen concentration exceeding $12 \times 10^{17}$ atoms/cm$^3$ (ASTM'79), they exhibit degraded electrical characteristics.

A semiconductor silicon single crystal wafer of the present invention is manufactured by the foregoing method according to the present invention, and exhibits good electrical characteristics such as an oxide film breakdown characteristic.

BRIEF DESCRIPTION OF THE DRAWINGS

FIG. 1 is a graph showing electrical characteristics of MOS diodes in Examples 1 and 2;

FIG. 2 is a graph showing electrical characteristics of MOS diodes in Examples 3 and 4; and FIG. 3 is a graph showing electrical characteristics of MOS diodes in Comparative Examples 1 and 2.

DETAILED DESCRIPTION OF THE PREFERRED EMBODIMENTS

The present invention will be further described in connection with several manufacturing examples and practical examples. It goes without saying that these examples only illustrates preferred specific implementation of the present invention, and it should not be construed that the present invention is limited to these specific examples.

MANUFACTURING EXAMPLE 1

110 kg of starting polysilicon chunks were charged in a quartz crucible of 22"ø in diameter, and boron was added to make a single crystal having a resistivity of 10 Ω·cm. An Ar gas was provided into a growth furnace and a pressure therein was adjusted for removing foreign substances of SiO evaporated from a silicon melt. The polysilicon chunks were melted by a resistance heating element. Then, a seed crystal was immersed in the silicon melt, and the seed was rotated in the counter-clockwise direction, while the crucible was rotated in the clockwise direction, at 6 rpm. Dislocation introduced into the seed crystal due to thermal stress was eliminated in a necking step, and a silicon single crystal having a diameter of 200 mm (8"ø) was grown by the CZ method. An oxygen concentration was measured for this silicon single crystal by the Fourier transformation infrared spectroscopy (FT-IR) and shown in Table 1. It should be noted that the measured value of oxygen concentration in Table 1 was the value measured in conformity to ASTM'79.

MANUFACTURING EXAMPLE 2

A silicon single crystal having a diameter of 200 mm was grown under similar conditions to those of Manufacturing Example 1 except that boron was added to make a single crystal having a resistivity of 0.012 Ω·cm in another batch process for growing a low resistivity crystal. An oxygen concentration was measured for this silicon single crystal by the gas fusion analysis method (GFA) and shown in Table 1.

COMPARATIVE MANUFACTURING EXAMPLE 1

For comparison, a silicon single crystal was grown under conditions similar to those of Manufacturing Example 1 except that 150 kg of polysilicon chunks were charged in a quartz crucible of 24"ø in diameter, and boron was added to make a single crystal having a resistivity of 10 Ω·cm. An oxygen concentration was measured for this silicon single crystal by FT-IR and shown in Table 1.

COMPARATIVE MANUFACTURING EXAMPLE 2

A silicon single crystal was grown under similar conditions to those of Comparative Manufacturing Example 1 except that boron was added to make a single crystal having a resistivity of 0.012 Ω·cm. An oxygen concentration was measured for this silicon single crystal by GFA and shown in Table 1.

TABLE 1

|  | Pulling Method | Crucible Diameter ("φ) | Polysilicon Charge Amount (kg) | Resistivity (Ω · cm) | Oxygen Concentration ($\times 10^7$ atoms/cm$^8$) |
|---|---|---|---|---|---|
| Manufacturing Example 1 | CZ Method | 22 | 110 | 10.00 | 10.60 |
| Manufacturing Example 2 | CZ Method | 22 | 110 | 0.012 | 12.00 |
| Comparative Example 1 | CZ Method | 24 | 150 | 10.45 | 14.56 |
| Comparative Example 1 | CZ Method | 24 | 150 | 0.011 | 14.75 |

MANUFACTURING EXAMPLE 3

150 kg of starting polysilicon chunks were charged in a quartz crucible of 24"ø in diameter, and boron was added to make a single crystal having a resistivity of 10 Ω·cm. The MCZ method was employed with a horizontal magnetic field generator disposed around a growth furnace. An Ar gas was provided into a growth furnace and a pressure therein was adjusted for removing foreign substances of SiO evaporated from a silicon melt. The polysilicon chunks were melted by a resistance heating element. A horizontal magnetic field was applied to the melt at a strength of 4000 G (gauss) at the center of the melt. Then, a seed crystal was immersed in the silicon melt, and the seed was rotated in the counter-clockwise direction, while the crucible was rotated in the clockwise direction, at 1.3 rpm. Dislocation introduced into the seed crystal due to thermal stress was eliminated in a necking step, and a silicon single crystal having a diameter of 200 mm (8"ø) was grown. An oxygen concentration was measured for this silicon single crystal by FT-IR and shown in Table 2. It should be noted that the measured value of oxygen concentration in Table 2 was the value measured in conformity to ASTM'79.

MANUFACTURING EXAMPLE 4

A silicon single crystal was grown under similar conditions to those of Manufacturing Example 3 except that boron was added to make a single crystal having a resistivity of 0.012 Ω·cm in another batch process for growing a low resistance crystal. An oxygen concentration was measured for this silicon single crystal by GFA and shown in Table 2.

TABLE 2

| | Pulling Method | Crucible Diameter ("φ) | Polysilicon Charge Amount (kg) | Resistivity (Ω · cm) | Oxygen Concentration (×10$^7$ atoms/cm$^8$) |
|---|---|---|---|---|---|
| Manufacturing Example 3 | MCZ | 24 | 150 | 10.52 | 11.80 |
| Manufacturing Example 4 | MCZ | 24 | 150 | 0.012 | 11.84 |

EXAMPLE 1

A silicon single crystal produced in Manufacturing Example 1 was subjected to cylindrical grinding, slicing, lapping and polishing steps to obtain wafers. A silicon single crystal was epitaxially grown on each of the wafers in a thickness of 6 μm. The respective epitaxial layers were adjusted to have a resistivity of 12 Ω·cm.

For artificially simulating heat treatment processes in the semiconductor manufacturing, CMOS heat treatments at 1000° C. for four hours (in dry $O_2$ atmosphere); 1150° C. for 13 hours (in $N_2$ atmosphere); and 1000° C. for six hours (in dry $O_2$ atmosphere) were applied to the above-mentioned epitaxial wafers. Each of the wafers applied with these treatments were cleaned, and subjected to gate oxidization to form an oxide film of 10 nm in thickness, thus fabricating polysilicon gate MOS diodes.

These MOS diodes were evaluated and counted as good chips in the case where they each exhibited an electrical characteristic that electrical field applied to the oxide film was 10 MV/cm or more when a current density applied through the oxide film was 1 mA/cm$^2$ under conditions that the area of the gate electrode was 8 mm$^2$, a current density in decision was at 1 mA/cm$^2$, and the number of measured diodes was 100 chips per wafer. The number of good chips was divided by the total number of evaluated diodes to derive a value which was used as a C-mode yield (good chip yield) for evaluating the electrical characteristic.

This example (high resistivity, CZ method and low oxygen concentration articles) exhibited the C-mode yield of 92% on the average, thus exhibiting extremely good electrical characteristics. For the evaluation of the electrical characteristics, two wafers were used for each example. The C-mode yield resulting from this example is shown in FIG. 1 together with the C-mode yield of Example 2 (low resistivity, CZ method and low oxygen concentration articles) described below.

EXAMPLE 2

A silicon single crystal produced in Manufacturing Example 2 was used to fabricate polysilicon gate MOS diodes in a manner similar to Example 1, and similarly evaluated for the electrical characteristic. This example (low resistivity, CZ method and low oxygen concentration articles) exhibited the C-mode yield of 86% on the average, thus indicating good electrical characteristics. The C-mode yield resulting from this example is shown in FIG. 1 together with the C-mode yield of Example 1 (high resistivity, CZ method and low oxygen concentration articles) described above.

EXAMPLE 3

A silicon single crystal produced in Manufacturing Example 3 were used to fabricate polysilicon gate MOS diodes in a manner similar to Example 1, and similarly evaluated for the electrical characteristics. This example (high resistivity, MCZ method and low oxygen concentration articles) exhibited the C-mode yield of 83% on the average, thus indicating good electrical characteristics. The C-mode yield resulting from this example is shown in FIG. 2 together with the C-mode yield of Example 4 (low resistivity, MCZ method and low oxygen concentration articles) described below.

EXAMPLE 4

A silicon single crystal produced in Manufacturing Example 4 was used to fabricate polysilicon gate MOS diodes in a manner similar to Example 1, and similarly evaluated for the electrical characteristics. This example (low resistivity, MCZ method and low oxygen concentration articles) exhibits the C-mode yield of 87% on the average, thus indicating good electrical characteristics. The C-mode yield resulting from this example is shown in FIG. 2 together with the C-mode yield of Example 3 (high resistivity, MCZ method and low oxygen concentration articles) described above.

COMPARATIVE EXAMPLE 1

A silicon single crystal produced in Comparative Manufacturing Example 1 was used to fabricate polysilicon gate MOS diodes in a manner similar to Example 1, and similarly evaluated for the electrical characteristic. This comparative example (high resistivity, CZ method and high oxygen concentration articles) exhibited the C-mode yield of 68% on the average, thus indicating the degraded electrical characteristic. The C-mode yield resulting from this comparative example is shown in FIG. 3 together with the C-mode yield of Comparative Example 2 (low resistivity, CZ method and high oxygen concentration articles) described above.

COMPARATIVE EXAMPLE 2

A silicon single crystal produced in Comparative Manufacturing Example 2 was used to fabricate polysilicon gate MOS diodes in a manner similar to Example 1, and similarly evaluated for the electrical characteristic. This comparative example (low resistivity, CZ method and high oxygen concentration articles) exhibited the C-mode yield of 58% on the average, thus indicating significantly degraded electrical characteristics. The C-mode yield resulting from this comparative example is shown in FIG. 3 together with the C-mode yield of Comparative Example 1 (high resistivity, CZ method and high oxygen concentration articles) described above.

As is apparent from the results of measuring the electrical characteristics of the foregoing Examples 1–4 and Comparative Examples 1–2, the silicon single crystals with a lower oxygen concentration in crystal (Examples 1–4) exhibit good characteristics, i.e., the C-mode yield generally exceeding 80% associated with the oxide film breakdown strength, whereas the silicon single crystals containing oxygen in high concentration (Comparative Examples 1–2) exhibit the C-mode yield approximately from 55 to 70%. It is therefore revealed that good electrical characteristics can be ensured by epitaxially growing a silicon single crystal on a silicon wafer having a low oxygen concentration as shown in Examples 1–4, whereas the electrical characteristics are degraded when a silicon single crystal is epitaxially grown on a silicon wafer having a high oxygen concentration as shown in Comparative Examples 1–2.

As described above, the present invention is advantageous in that semiconductor silicon single crystal wafers exhibiting the good electrical characteristics can be manufactured at a low cost.

Obviously various minor changes and modifications of the present invention are possible in the light of the above teaching. It is therefore to be understood that within the scope of the appended claims the invention may be practiced otherwise than as specifically described.

What is claimed is:

1. A method of manufacturing a semiconductor silicon single crystal wafer comprising the steps of:

producing a semiconductor silicon single crystal having a resistivity in a range of 0.005 to 0.02 Ω·cm and an oxygen concentration of $12 \times 10^{17}$ atoms/cm$^3$ (ASTM'79) or less by a Czochralski method;

shaping said silicon single crystal into a silicon single crystal wafer; and epitaxially growing a silicon single crystal on said silicon single crystal wafer.

2. A method of manufacturing a semiconductor silicon single crystal wafer according to claim 1, wherein said silicon single crystal is produced by a magnetic field applied Czochralski method.

3. A semiconductor silicon single crystal wafer having good electrical characteristics manufactured by a method of manufacturing a semiconductor silicon single crystal wafer according to claim 2.

4. A semiconductor silicon single crystal wafer having good electrical characteristics manufactured by a method of manufacturing a semiconductor silicon single crystal wafer according to claim 1.

5. A method of manufacturing a semiconductor silicon single crystal wafer comprising the steps of:

producing a semiconductor silicon single crystal having a resistivity in a range of 1 to 30 Ω·cm and an oxygen concentration of $12 \times 10^{17}$ atoms/cm$^3$ (ASTM'79) or less by a Czochralski method;

shaping said silicon single crystal into a silicon single crystal wafer; and epitaxially growing a silicon single crystal on said silicon single crystal wafer.

6. A method of manufacturing a semiconductor silicon single crystal wafer according to claim 5, wherein said silicon single crystal is produced by a magnetic field applied Czochralski method.

7. A semiconductor silicon single crystal wafer having good electrical characteristics manufactured by a method of manufacturing a semiconductor silicon single crystal wafer according to claim 5.

8. A semiconductor silicon single crystal wafer having good electrical characteristics manufactured by a method of manufacturing a semiconductor silicon single crystal wafer according to claim 4.

* * * * *